(12) United States Patent
Zhang

(10) Patent No.: US 11,409,170 B2
(45) Date of Patent: Aug. 9, 2022

(54) ARRAY SUBSTRATE AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yihe Zhang, Shenzhen (CN)

(*) Notice: Subject to any disclaimer, the term of this patent is extended or adjusted under 35 U.S.C. 154(b) by 127 days.

(21) Appl. No.: 16/980,446

(22) PCT Filed: Jul. 3, 2020

(86) PCT No.: PCT/CN2020/100213
§ 371 (c)(1),
(2) Date: Sep. 14, 2020

(87) PCT Pub. No.: WO2021/237877
PCT Pub. Date: Dec. 2, 2021

(65) Prior Publication Data
US 2021/0373394 A1  Dec. 2, 2021

(30) Foreign Application Priority Data
May 28, 2020 (CN) .......................... 202010465161.3

(51) Int. Cl.
*G02F 1/1362* (2006.01)
*H01L 27/12* (2006.01)
*G02F 1/1343* (2006.01)

(52) U.S. Cl.
CPC .. *G02F 1/136209* (2013.01); *G02F 1/136213* (2013.01); *G02F 1/136286* (2013.01); *H01L 27/124* (2013.01); *G02F 1/134363* (2013.01)

(58) Field of Classification Search
CPC ..................................................... G02F 1/1362
See application file for complete search history.

(56) References Cited

U.S. PATENT DOCUMENTS

| 2008/0136992 A1* | 6/2008 | Kim | G02F 1/133514 |
| | | | 349/48 |
| 2010/0079694 A1* | 4/2010 | Yoshida | G02F 1/134363 |
| | | | 349/40 |

FOREIGN PATENT DOCUMENTS

| CN | 109445246 A | | 3/2019 | |
| CN | 110346995 A | | 10/2019 | |
| CN | 110928090 | * | 3/2020 | ........... G02F 1/1343 |
| CN | 110928090 A | | 3/2020 | |
| CN | 111081717 A | | 4/2020 | |
| JP | 2001100389 A | | 4/2001 | |
| JP | 2018064047 A | | 4/2018 | |

* cited by examiner

*Primary Examiner* — Sang V Nguyen

(57) ABSTRACT

An array substrate and a display panel are provided. The array substrate includes a substrate, a first metal layer, an active material layer, a second metal layer, a pixel electrode layer, and a common electrode layer. The first metal layer includes a gate electrode layer, scan lines, and a shielding metal layer. The shielding metal layer includes a plurality of shielding metal wirings. At least one corner on a portion of each of the shielding metal wirings overlapping pixel opening areas is designed as an outer corner, and a protrusion is arranged at the outer corner, thereby relieving light leakage at metal intersections.

19 Claims, 5 Drawing Sheets

ARRAY SUBSTRATE AND DISPLAY PANEL

FIELD OF INVENTION

The present disclosure relates to the field of display technologies, and particularly relates to an array substrate and a display panel.

BACKGROUND OF INVENTION

Contrast is an important parameter of display devices, which can vividly show differences of bright states and dark state of an image. Because liquid crystal display devices cannot self-illuminate, additional backlights are generally required to provide brightness. Liquid crystals are affected by irregular electric fields or terrains in dark state, and the brightness of the backlights will be perceived by human eyes through a liquid crystal layer in some positions, which results in an increase of the brightness in the dark state and affects visual effect.

In general, there are many kinds of opaque metal wirings in an array substrate. Due to process factors, an ideal right angle cannot be formed at corners of the metal wirings, so the metal wirings are not perpendicular or parallel to a polarizer, thereby causing electric fields to excite escaping electrons and change a polarization state, which leads to light leakage in dark state. As shown in FIG. 2, a shielding metal layer 8' in prior art refers to a circular and closed ring composed with a first shielding metal wiring 81' and a second shielding metal wiring 82'. Four corners 10' of the shielding metal layer 8' located in a pixel opening area 31' are all inner corners, and there are four metal intersections which are light leakage points in the dark state. A general solution is to pre-set a compensation pattern at the inner corners by mask compensation. However, effects of the mask compensation on the inner corners are not obvious compared with those on outer corners, which leads to serious light leakage in the dark state and poor contrast.

In summary, a new array substrate and a new display panel need to be provided to solve the technical problems above.

Technical Problems

An array substrate and a display panel provided in the present disclosure solve technical problems that while shielding metal wirings of an array substrate and a display panel in prior art are designed as a closed and circular ring, four metal intersections present as inner corners and effects of mask compensation on the inner corners are not obvious, thereby resulting in serious light leakage in dark state and poor contrast.

Technical Solutions

In order to solve the above problems, the present disclosure provides technical solutions as follows:

An embodiment of the present disclosure provides an array substrate, including:
a substrate;
a first metal layer disposed on the substrate, wherein the first metal layer includes a gate electrode layer of switch components, a plurality of scan lines connected to the gate electrode layer, and a shielding metal layer;
an active material layer disposed on the first metal layer;
a second metal layer disposed on the active material layer, wherein the second metal layer includes a source electrode layer of the switch components, a drain electrode layer of the switch component, and a plurality of data lines crossed with the scan lines, wherein the scan lines and the data lines are crossed to define a plurality of pixel opening areas;
a pixel electrode layer disposed in the pixel opening areas and partially overlapping with the shielding metal layer; and
a common electrode layer disposed on the data lines;
wherein the shielding metal layer is disposed between the pixel electrode layer and the data lines, the shielding metal layer includes a plurality of shielding metal wirings, each of the shielding metal wirings includes at least one corner at a portion overlapping the pixel opening areas, the corner is an outer corner arranged relative to the pixel electrode layer, and a protrusion is arranged at the outer corner.

According to the array substrate provided in an embodiment of the present disclosure, each of the shielding metal wirings includes a first shielding metal wiring and a second shielding metal wiring which are arranged end to end in a closed ring, the first shielding metal wiring is arranged in parallel with the data lines, and the second shielding metal wiring is arranged in parallel with the scan lines;
wherein the outer corner is arranged at opposite ends of the first shielding metal wiring and/or the second shielding metal wiring.

According to the array substrate provided in an embodiment of the present disclosure, the outer corner includes a first outer corner, each of the opposite ends of the first shielding metal wiring includes a first bending section and a second bending section connected to the first bending section, the first bending section bends in a direction close to and perpendicular to the data lines, the second bending section bends in an extending direction of the data lines, and the first outer corner is arranged at the first bending section.

According to the array substrate provided in an embodiment of the present disclosure, the first bending section further includes a first inner corner, and an orthographic projection of the data lines on the substrate covers an orthographic projection of the first inner corner on the substrate.

According to the array substrate provided in an embodiment of the present disclosure, two first shielding metal wirings are symmetrically distributed on opposite sides of each of the data lines, each of two first shielding metal wirings includes a part which is connected to the second bending section and extended along the data lines, and two parts of the two first shielding metal wirings are combined to form a trace which is connected to the second shielding metal wiring.

According to the array substrate provided in an embodiment of the present disclosure, an orthographic projection of the common electrode layer on the substrate covers an orthographic projection of a first inner corner on the substrate.

According to the array substrate provided in an embodiment of the present disclosure, the outer corner includes a second outer corner, each of the opposite ends of the second shielding metal wiring includes a third bending section and a fourth bending section connected to the third bending section, the third bending section bends in a direction close to and perpendicular to the data lines, the fourth bending section bends in an extending direction of the data lines, and the second outer corner is arranged at the third bending section.

According to the array substrate provided in an embodiment of the present disclosure, the third bending section further includes a second inner corner, and an orthographic projection of the scan lines on the substrate covers an orthographic projection of the second inner corner on the substrate.

According to the array substrate provided in an embodiment of the present disclosure, an orthographic projection of the protrusion on the substrate is a figure enclosed by line segments, and corners of the figure enclosed by the line segments have right angles.

An embodiment of the present disclosure provides an array substrate, including:

a substrate;

a first metal layer disposed on the substrate, wherein the first metal layer includes a gate electrode layer of switch components, a plurality of scan lines connected with the gate electrode layer, and a shielding metal layer;

an active material layer disposed on the first metal layer;

a second metal layer disposed on the active material layer, wherein the second metal layer includes a source electrode layer of the switch components, a drain electrode layer of the switch components, and a plurality of data lines crossed with the scan lines, wherein the scan lines and the data lines are crossed to define a plurality of pixel opening areas;

a pixel electrode layer disposed in the pixel opening areas and partially overlapping with the shielding metal layer; and a common electrode layer disposed on the data lines;

wherein the shielding metal layer includes a plurality of shielding metal wirings, an overlapped part of the shielding metal wirings and the pixel opening areas has at least one corner, the corner is an outer corner arranged relative to the pixel electrode layer, and a protrusion is arranged at the outer corner.

According to the array substrate provided in an embodiment of the present disclosure, each of the shielding metal wirings includes a first shielding metal wiring and a second shielding metal wiring which are connected end to end in a closed ring, the first shielding metal wiring is arranged in parallel with the data lines, and the second shielding metal wiring is arranged in parallel with the scan lines;

wherein the outer corner is arranged at opposite ends of the first shielding metal wiring and/or the second shielding metal wiring.

According to the array substrate provided in an embodiment of the present disclosure, the outer corner includes a first outer corner, each of the opposite ends of the first shielding metal wiring include a first bending section and a second bending section connected to the first bending section, and the first bending section bends in a direction close to and perpendicular to the data lines, the second bending section bends in an extending direction of the data lines, and the first outer corner is arranged at the first bending section.

According to the array substrate provided in an embodiment of the present disclosure, the first bending section further includes a first inner corner, and an orthographic projection of the data lines on the substrate covers an orthographic projection of the first inner corner on the substrate.

According to the array substrate provided in an embodiment of the present disclosure, two first shielding metal wirings are symmetrically distributed on opposite sides of each of the data lines, each of two first shielding metal wirings includes a part which is connected to the second bending section and extended along the data lines, and two parts of the two first shielding metal wirings are combined to form a trace which is connected to the second shielding metal wiring.

According to the array substrate provided in an embodiment of the present disclosure, an orthographic projection of the common electrode layer on the substrate covers an orthographic projection of a first inner corner on the substrate.

According to the array substrate provided in an embodiment of the present disclosure, the outer corner includes a second outer corner, each of the opposite ends of the second shielding metal wiring includes a third bending section and a fourth bending section connected to the third bending section, the third bending section bends in a direction close to and perpendicular to the data lines, the fourth bending section bends in an extending direction of the data lines, and the second outer corner is arranged at the third bending section.

According to the array substrate provided in an embodiment of the present disclosure, the third bending section further includes a second inner corner, and an orthographic projection of the scan lines on the substrate covers an orthographic projection of the second inner corner on the substrate.

According to the array substrate provided in an embodiment of the present disclosure, an orthographic projection of the protrusion on the substrate is a figure enclosed by line segments, and corners of the figure enclosed by the line segments have right angles.

An embodiment of the present disclosure provides a display panel including the above-mentioned array substrate.

Beneficial Effects

The beneficial effects of the present disclosure are as follows: in the array substrate and the display panel provided in the present disclosure, at least one inner corner of the shielding metal wirings at a portion overlapping the pixel opening areas is designed as an outer corner arranged relative to the pixel electrode, and a convex part is arranged at the outer corner by mask compensation, so the outer corner which cannot form an ideal right angle due to process factors can be compensated to be a right angle, thereby relieving light leakage of the metal intersections in the pixel opening areas, relieving light leakage in dark state, and improving contrast of display images.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF EMBODIMENTS

Figure 1:
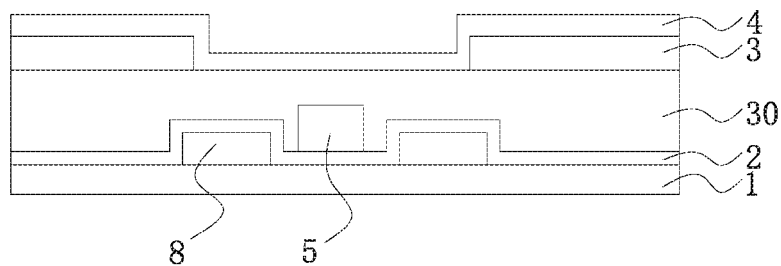
FIG. 1 is a sectional structural schematic view of a first array substrate provided by an embodiment of the present disclosure.
Figure 2:
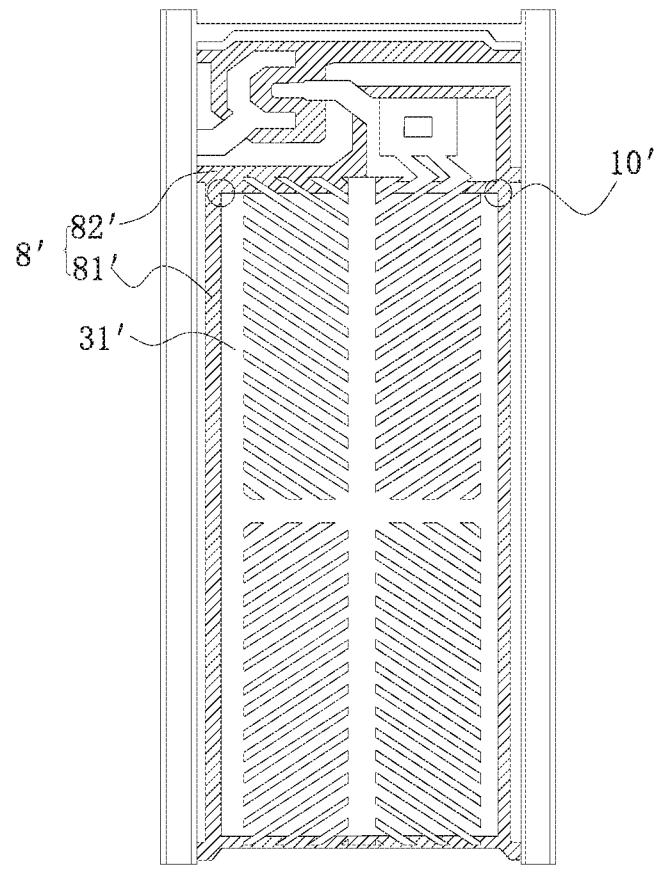
FIG. 2 is a top-down structural schematic view of an array substrate in the prior art.

The following description of the various embodiments is provided to illustrate the specific embodiments. Directional terms described by the present disclosure, such as "top", "bottom", "front", "back", "left", "right", "inner", "outer", "side", "vertical", "level", etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first", "second", and "third" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection. It can mean a mechanical connection, an electrical connection, or can communicate with each other. It can mean a direct connection, an indirect connection by an intermediate, or an inner communication or an interaction between two elements. Those skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

An array substrate and a display panel provided in the present disclosure solve technical problems that while shielding metal wirings of an array substrate and a display panel in prior art are designed as a closed and circular ring, four metal intersections present as inner corners and effects of mask compensation on the inner corners are not obvious, thereby resulting in serious light leakage in dark state and poor contrast. The embodiments of the present disclosure can solve this defect.

Figure 3:
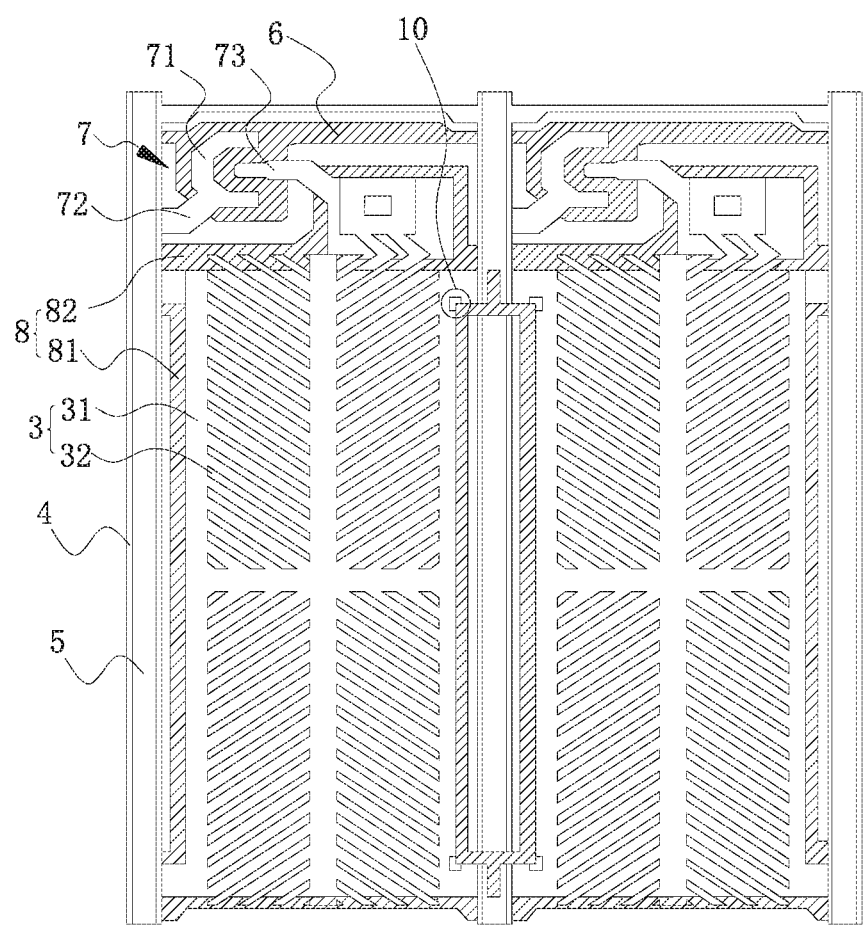
FIG. 3 is a top-down structural schematic view of the first array substrate provided by an embodiment of the present disclosure.

Referring to FIG. 1 and FIG. 3, an embodiment of the present disclosure provides an array substrate including a substrate 1, a first metal layer, an active material layer 2, a second metal layer, a pixel electrode layer 3, and a common electrode layer 4, wherein the substrate 1 may be a glass substrate. Data lines 5, scan lines 6, switch components 7, the pixel electrode layer 3, a shielding metal layer 8, and the common electrode layer 4 are stacked on the substrate 1 to ensure structural stability. Wherein the switch component 7 include a gate electrode layer 71, a source electrode layer 72, and a drain electrode layer 73.

The first metal layer is disposed on the substrate 1. The first metal layer includes the gate electrode layer 71 of the switch components 7, the scan lines 6 connected with the gate electrode layer 71, and the shielding metal layer 8. The active material layer 2 includes a gate insulating layer, a semiconductor layer, and an ohmic contact layer of the switch components 7, and the gate insulating layer, the semiconductor layer, and the ohmic contact layer are sequentially stacked. The second metal layer is disposed on the active material layer 2 and includes the source electrode layer 72 of the switch components 7, the drain electrode layer 73 of the switch components 7, and the data lines 5 crossed with the scan lines 6. The switch components 7 are located at intersections of the scan lines 6 and the data lines 5, the gate electrode layer 71 is connected to the scan lines 6, the source electrode layer 72 is connected to the data lines 5, and the drain electrode layer 73 is connected with the pixel electrode layer 3. A plurality of the data lines 5 cross with the scan lines 6 to define a plurality of pixel opening areas 31. The pixel electrode layer 3 includes pixel electrodes 32 arranged in the pixel opening areas 31. The common electrode layer 4 is disposed on the data lines 5, the common electrode layer 4 and the data lines 5 are insulated there between, and the common electrode layer 4 is electrically connected to the data lines 5 through holes.

Specifically, the shielding metal layer 8 is disposed between the pixel electrode layer 3 and the data lines 5, and is configured to shield electrical effects of the pixel electrode layer 3 when a data signal voltage is input to the data lines 5, so that electric fields of the pixel electrode layer 3 will not be disturbed, thereby improving display uniformity of images and ensuring display quality. The pixel electrode layer 3 is partially overlapping with the shielding metal layer 8, so the shielding metal layer 8 can be coupled with the pixel electrode layer 3 to form a storage capacitor. The shielding metal layer 8 and the common electrode layer 4 are electrically connected to a same common voltage Vcom.

In an embodiment of the present disclosure, the shielding metal layer 8 includes a plurality of shielding metal wirings, each of the shielding metal wirings includes at least one corner 10 at a portion overlapping the pixel opening areas 31. The corner 10 is an outer corner arranged relative to the pixel electrode layer 3, so as to prevent the shielding metal wirings from having an inner corner which has no obvious effect when the mask compensation is applied in the pixel opening area 31. Furthermore, a protrusion 9 is arranged at the outer corner to relieve light leakage in the dark state caused by process factors through the mask compensation.

It should be noted that, "the outer corner" and "the inner corner" mentioned in the embodiment of the present disclosure are all named for positions of the corners relative to the pixel electrode layer.

Furthermore, an orthographic projection of the protrusion 9 on the substrate 1 is a figure enclosed by line segments, and corners of the figure enclosed by the line segments have right angles, which can effectively prevent electrons excited by the electric fields when the shielding metal layer 8 is not perpendicular or parallel to a polarizer from escaping and changing a polarization state and causing the light leakage in the dark state, so as to significantly improve the contrast of display images.

Furthermore, each of the shielding metal wirings includes a first shielding metal wiring 81 and a second shielding metal 82 wiring which are arranged end to end in a closed ring. The first shielding metal wiring 81 is arranged in parallel with the data lines 5, and the second shielding metal wiring 82 is arranged in parallel with the scan lines 6. Wherein the outer corner is arranged at opposite ends of the first shielding metal wiring 81 and/or the second shielding metal wiring 82, that is, in the embodiment of the present disclosure, either only the first shielding wiring 81, only the second shielding wiring 82, or both the first shielding wiring 81 and second shielding wirings 82 can be configured to include the outer corner.

Figure 4:
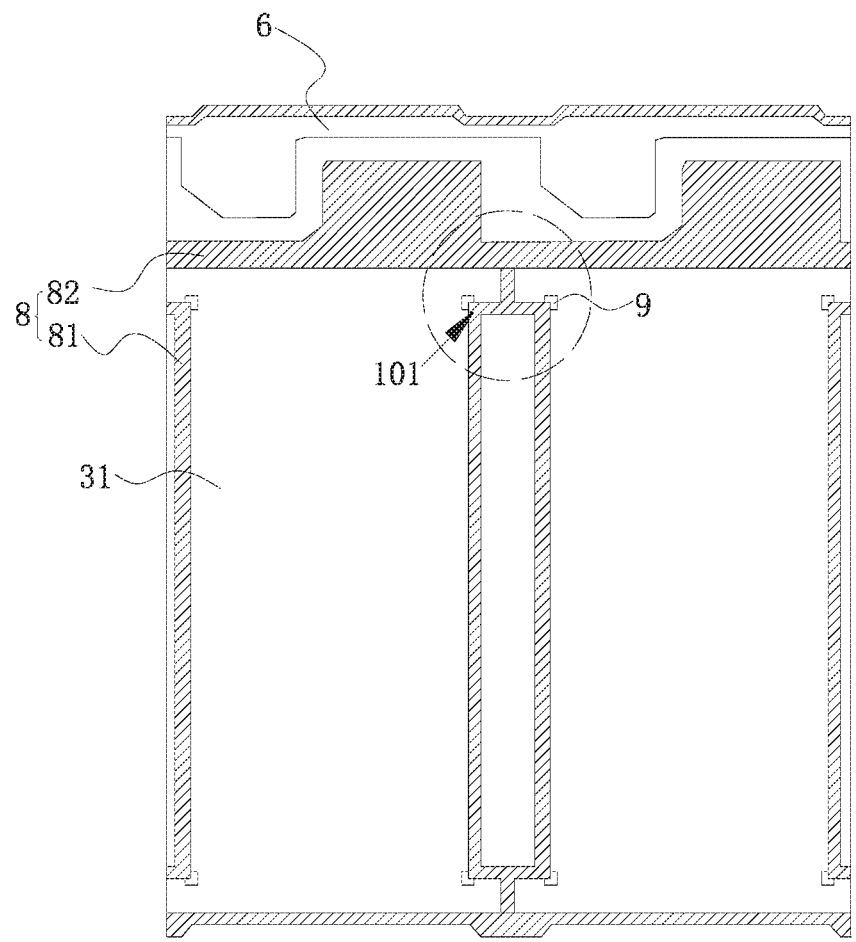
FIG. 4 is a simplified structural schematic view of the first array substrate in FIG. 3.
Figure 5:
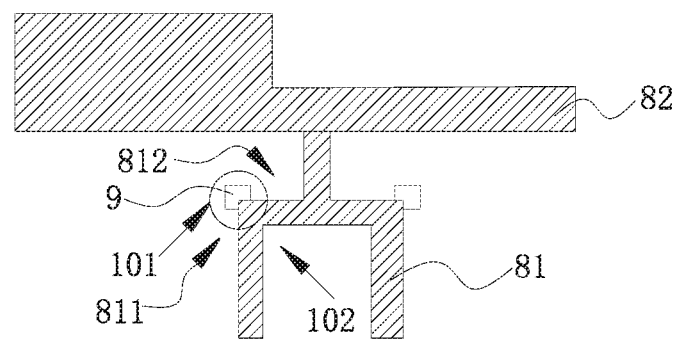
FIG. 5 is a partially enlarged view of the first array substrate in FIG. 4.

Referring to FIG. 3, FIG. 4, and FIG. 5, when only the first shielding wiring 81 is configured to include the outer corner, each of the opposite ends of the first shielding metal wiring 81 includes a first bending section 811 and a second bending section 812 connected to the first bending section 811, the first bending section 811 bends in a direction close to and perpendicular to the data lines 5, and the second bending section 812 bends in an extending direction of the data lines 5; wherein the first bending section 811 and the second bending section 812 are formed successively in order. Each of the opposite ends of the first shielding metal wiring 81 includes a first section, a second section, and a third section. The first section is equivalent to a main body section of the first shielding metal wiring 81, the second section and the third section are formed after the first shielding metal wiring 81 is bent, and the third section is arranged in a gap between the first section and the data lines 5, that is, the first section and the second section together form the first bending section, and the second section and the third section together form the second bending section 812. Therefore, the corner of the first shielding metal wiring 81 positioned in the pixel opening area 31 is only a first outer corner 101 at the first bending section 812, and other corners are all positioned outside the pixel opening area 31, therefore, the other corners will not cause the issue of the light leak in the dark state.

The first bending section 811 further includes a first inner corner 102, and an orthographic projection of the data lines 5 on the substrate 1 covers an orthographic projection of the first inner corner 102 on the substrate 1. Because the data lines 5 are opaque, light leakage in the dark state caused by the first inner corner 102 can be prevented. And since the common electrode layer 4 is on the data lines 5, an orthographic projection of the common electrode layer 4 on the substrate 1 covers the orthographic projection of the first inner corner 102 on the substrate 1, so that the first inner corner 102 extending outwards is hidden under the data lines 5 and the common electrode layer 4.

Furthermore, two first shielding metal wirings 81 are symmetrically distributed on opposite sides of each of the data lines 5, each of the two first shielding metal wirings 81 includes a part which is connected to the second bending section 812 and extended along the data lines 5, and two parts are combined to form a trace connected to the second shielding metal wiring 82. It can be understood that the two third sections of the two first shielding metal wirings 81 are combined into one, which can effectively utilize space.

Figure 6:
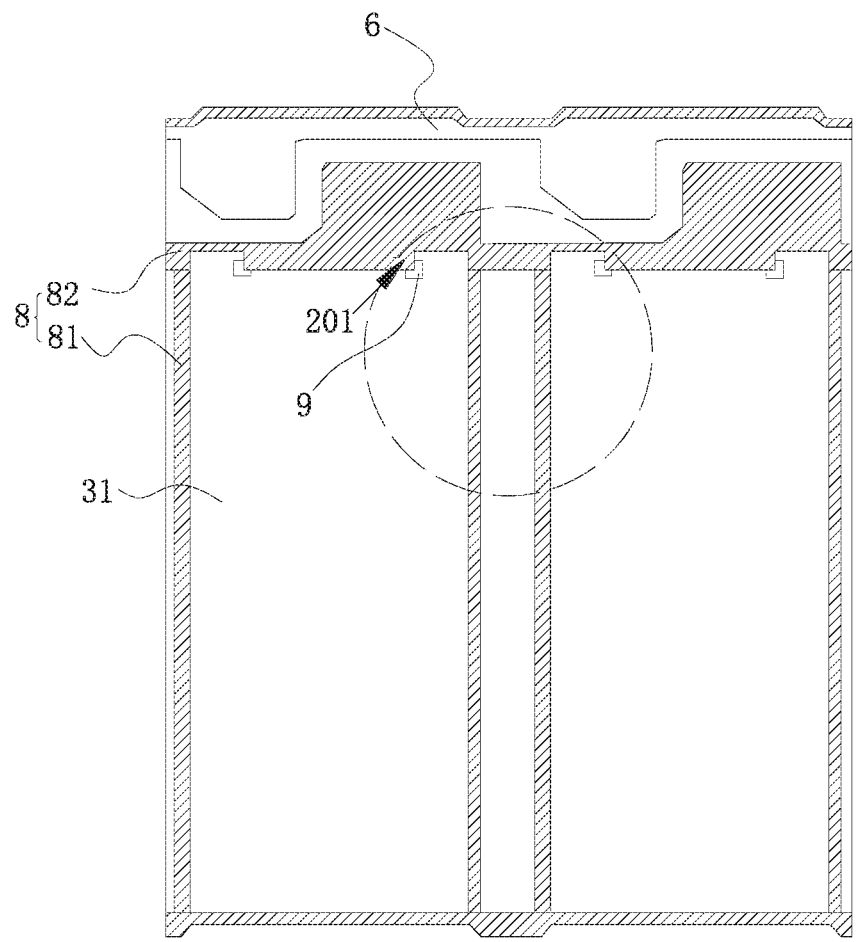
FIG. 6 is a simplified top-down structural schematic view of a second array substrate provided by an embodiment of the present disclosure.
Figure 7:
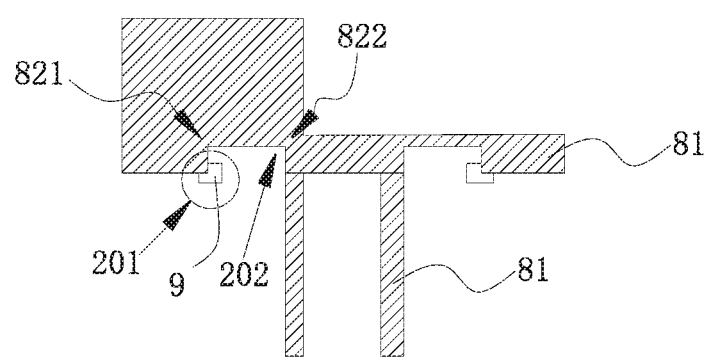
FIG. 7 is a partially enlarged view of the second array substrate in FIG. 6.

Referring to FIG. 6 and FIG. 7, when only the second shielding wiring 82 is configured to include the outer corner, similarly, the outer corner includes a second outer corner 201, both ends of the second shielding metal wiring 82 include a third bending section 821 and a fourth bending section 822 connected to the third bending section 821. The third bending section 821 bends in a direction close to and perpendicular to the data lines 5, and the fourth bending section 822 bends in an extending direction of the data lines 5. The second outer corner 201 is arranged at the third bending section 821. The corner of the second shielding metal wiring 82 positioned in the pixel opening area 31 is only the second outer corner 201 at the third bending section 812, and the other corners are all arranged outside the pixel opening area 31; therefore, other corners will not cause the problems of the light leak in the dark state.

Similarly, the third bending section 821 further includes a second inner corner 202, and an orthographic projection of the scan lines 6 on the substrate 1 covers an orthographic projection of the second inner corner 202 on the substrate 1.

Figure 8:
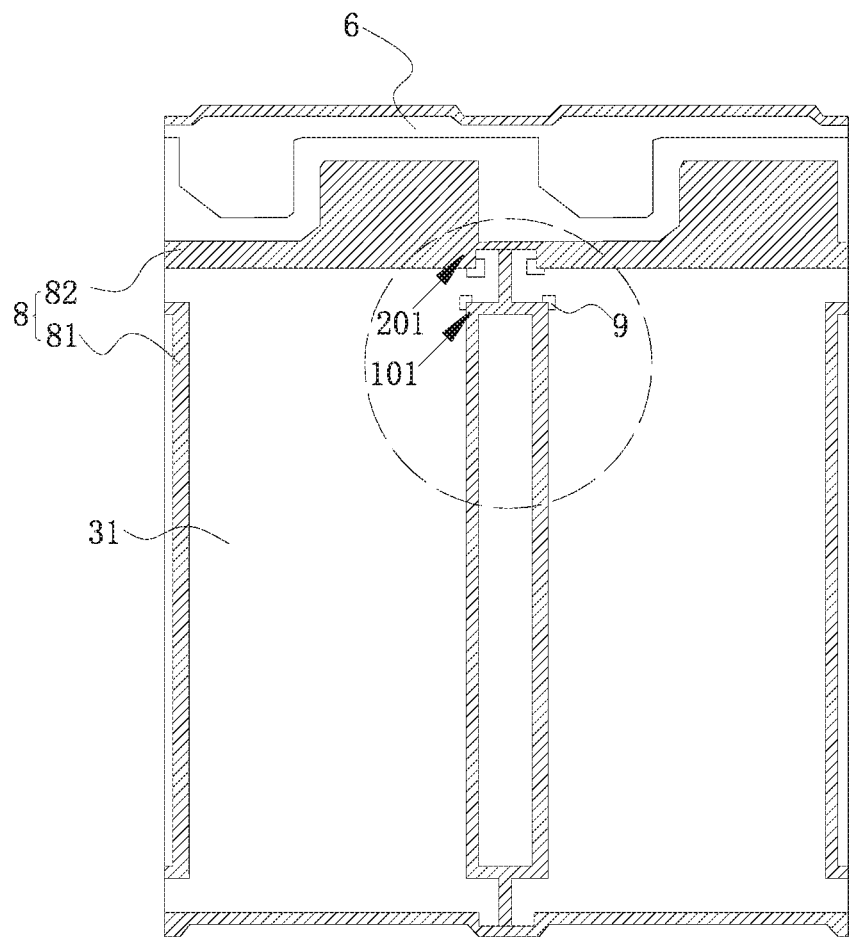
FIG. 8 is a simplified top-down structural schematic view of a third array substrate provided by an embodiment of the present disclosure.
Figure 9:
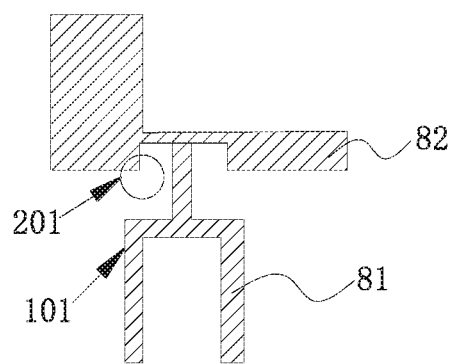
FIG. 9 is a partially enlarged view of the third array substrate in FIG. 8.

Referring to FIG. 8 and FIG. 9, when both the first shielding wiring 81 and second shielding wirings 82 are configured to include the outer corner at the same time, this situation is a combination of two above-mentioned situations, and details can refer to above descriptions, which will not be repeated herein.

It should be noted that the embodiments of the present disclosure are described by taking that each of the shielding metal wirings is a closed ring composed of the first shielding metal wiring and the second shielding metal wiring end to end as an example. Of course, the technical solutions provided in the present disclosure can also be applicable to the cases where each of the shielding metal wirings is in a non-closed shape, etc., which are within a protection scope of the present disclosure.

The present disclosure further provides a display panel. The display panel includes the array substrate, a color filter substrate disposed opposite to the array substrate, and a liquid crystal layer disposed between the array substrate and the color filter substrate. The color filter substrate includes a substrate, a plurality of color resist blocks disposed on the substrate, a black matrix disposed between two adjacent color resist blocks, and a common electrode layer 4 disposed on the color resist blocks. Liquid crystals in the liquid crystal layer are deflected under the electric fields generated by the pixel electrode layer 3 and the common electrode layer 4, thereby controlling light passing through the display panel to achieve display.

The beneficial effects of the present disclosure are as follows: in the array substrate and the display panel provided in the present disclosure, at least one inner corner of the shielding metal wirings at a portion overlapping the pixel opening areas is designed as an outer corner arranged relative to the pixel electrode, and a convex part is arranged at the outer corner by mask compensation, so the outer corner which cannot form an ideal right angle due to process factors can be compensated to be a right angle, thereby relieving light leakage of the metal intersections in the pixel opening areas, relieving light leakage in dark state, and improving contrast of the display images.

In summary, although the present disclosure has been disclosed as the above with preferred embodiments, the above preferred embodiments are not intended to limit the present invention. Those of ordinary skill in the art can make various changes and retouching without departing from the spirit and scope of the present disclosure. Therefore, a protection scope of the present disclosure is subject to a scope defined by the claims.

What is claimed is:

1. An array substrate, comprising:
   a substrate;
   a first metal layer disposed on the substrate, wherein the first metal layer comprises a gate electrode layer of switch components, a plurality of scan lines connected to the gate electrode layer, and a shielding metal layer;
   an active material layer disposed on the first metal layer;
   a second metal layer disposed on the active material layer, wherein the second metal layer comprises a source electrode layer of the switch components, a drain electrode layer of the switch components, and a plurality of data lines crossed with the scan lines, wherein the scan lines and the data lines are crossed to define a plurality of pixel opening areas;
   a pixel electrode layer disposed in the pixel opening areas and partially overlapping the shielding metal layer; and
   a common electrode layer disposed on the data lines;
   wherein the shielding metal layer comprises a plurality of shielding metal wirings, each of the shielding metal wirings comprises at least one corner at a portion overlapping the pixel opening areas, the corner is an outer corner arranged facing the pixel electrode layer, and a protrusion is arranged at the outer corner.

2. The array substrate in claim 1, wherein the shielding metal layer is disposed between the pixel electrode layer and the data lines, each of the shielding metal wirings comprises a first shielding metal wiring and a second shielding metal wiring which are connected end to end in a closed ring, the first shielding metal wiring is arranged in parallel with the data lines, and the second shielding metal wiring is arranged in parallel with the scan lines; wherein the outer corner is arranged at opposite ends of the first shielding metal wiring and/or the second shielding metal wiring.

3. The array substrate in claim 2, wherein the outer corner comprises a first outer corner, each of the opposite ends of the first shielding metal wiring comprises a first bending section and a second bending section connected to the first bending section, the first bending section bends in a direction close to and perpendicular to the data lines, the second bending section bends in an extending direction of the data lines, and the first outer corner is arranged at the first bending section.

4. The array substrate in claim 3, wherein the first bending section further comprises a first inner corner, and an orthographic projection of the data lines on the substrate covers an orthographic projection of the first inner corner on the substrate.

5. The array substrate in claim 3, wherein two first shielding metal wirings are symmetrically distributed on opposite sides of each of the data lines, each of the two first shielding metal wirings comprises a part which is connected to the second bending section and extended along the data lines, and two parts of the two first shielding metal wirings are combined to form a trace which is connected to the second shielding metal wiring.

6. The array substrate in claim 4, wherein an orthographic projection of the common electrode layer on the substrate covers an orthographic projection of a first inner corner on the substrate.

7. The array substrate in claim 2, wherein the outer corner comprises a second outer corner, each of the opposite ends of the second shielding metal wiring comprises a third bending section and a fourth bending section connected to the third bending section, the third bending section bends in a direction close to and perpendicular to the data lines, the fourth bending section bends in an extending direction of the data lines, and the second outer corner is arranged at the third bending section.

8. The array substrate in claim 7, wherein the third bending section further comprises a second inner corner, and an orthographic projection of the scan lines on the substrate covers an orthographic projection of the second inner corner on the substrate.

9. The array substrate in claim 1, wherein an orthographic projection of the protrusion on the substrate is a figure enclosed by line segments, and corners of the figure enclosed by the line segments have right angles.

10. The array substrate in claim 1, wherein the active material layer comprises a gate insulating layer, a semiconductor layer, and an ohmic contact layer arranged sequentially in the switch components.

11. An array substrate, comprising:
    a substrate;
    a first metal layer disposed on the substrate, wherein the first metal layer comprises a gate electrode layer of switch components, a plurality of scan lines connected to the gate electrode layer, and a shielding metal layer;
    an active material layer disposed on the first metal layer;
    a second metal layer disposed on the active material layer, wherein the second metal layer comprises a source electrode layer of the switch components, a drain electrode layer of the switch components, and a plurality of data lines crossed with the scan lines, wherein the scan lines and the data lines are crossed to define a plurality of pixel opening areas;

a pixel electrode layer disposed in the pixel opening areas and partially overlapping with the shielding metal layer; and a common electrode layer disposed on the data lines;

wherein the shielding metal layer comprises a plurality of shielding metal wirings, an overlapped part of the shielding metal wirings, each of the shielding metal wirings comprises at least one corner at a portion overlapping the pixel opening areas, the corner is an outer corner arranged facing the pixel electrode layer, and a protrusion is arranged at the outer corner, wherein each of the shielding metal wirings comprises a first shielding metal wiring and a second shielding metal wiring which are connected end to end in a closed ring, the first shielding metal wiring is arranged in parallel with the data lines, and the second shielding metal wiring is arranged in parallel with the scan lines;

wherein the outer corner is arranged at opposite ends of the first shielding metal wiring and/or the second shielding metal wiring.

12. The array substrate in claim 11, wherein the outer corner comprises a first outer corner, each of the opposite ends of the first shielding metal wiring comprises a first bending section and a second bending section connected to the first bending section, the first bending section bends in a direction close to and perpendicular to the data lines, the second bending section bends in an extending direction of the data lines, and the first outer corner is arranged at the first bending section.

13. The array substrate in claim 12, wherein the first bending section further comprises a first inner corner, and an orthographic projection of the data lines on the substrate covers an orthographic projection of the first inner corner on the substrate.

14. The array substrate in claim 12, wherein two first shielding metal wirings are symmetrically distributed on opposite sides of each of the data lines, each of the two first shielding metal wirings comprises a part which is connected to the second bending section and extended along the data lines, and two parts of the two first shielding metal wirings are combined to form a trace which is connected to the second shielding metal wiring.

15. The array substrate in claim 13, wherein an orthographic projection of the common electrode layer on the substrate covers an orthographic projection of a first inner corner on the substrate.

16. The array substrate in claim 11, wherein the outer corner comprises a second outer corner, each of the opposite ends of the second shielding metal wiring comprises a third bending section and a fourth bending section connected to the third bending section, the third bending section bends in a direction close to and perpendicular to the data lines, the fourth bending section bends in an extending direction of the data lines, and the second outer corner is arranged at the third bending section.

17. The array substrate in claim 16, wherein the third bending section further comprises a second inner corner, and an orthographic projection of the scan lines on the substrate covers an orthographic projection of the second inner corner on the substrate.

18. The array substrate in claim 11, wherein an orthographic projection of the protrusion on the substrate is a figure enclosed by line segments, and corners of the figure enclosed by the line segments have right angles.

19. A display panel, comprising the array substrate in claim 11.

* * * * *